United States Patent [19]

König

[11] 4,160,150
[45] Jul. 3, 1979

[54] METHOD AND APPARATUS FOR ENERGY BEAM WELDING

[75] Inventor: Dieter König, Munich, Fed. Rep. of Germany

[73] Assignee: Steigerwald Strahltechnik GmbH, Munich, Fed. Rep. of Germany

[21] Appl. No.: 904,293

[22] Filed: May 9, 1978

[30] Foreign Application Priority Data

May 11, 1977 [GB] United Kingdom ............... 19832/77

[51] Int. Cl.² ............................................. B23K 9/00
[52] U.S. Cl. .............................................. 219/121 EB
[58] Field of Search .................. 219/121 EB, 121 EM, 219/121 LM

[56] References Cited

U.S. PATENT DOCUMENTS

| | | | |
|---|---|---|---|
| 3,230,339 | 1/1966 | Opitz et al. ................. | 219/121 EM |
| 3,518,400 | 6/1970 | Gallivan ....................... | 210/121 EM |
| 3,743,776 | 7/1973 | Corcelle ...................... | 219/121 EB |

*Primary Examiner*—J. V. Truhe
*Assistant Examiner*—Fred E. Bell
*Attorney, Agent, or Firm*—Brumbaugh, Graves, Donohue & Raymond

[57] ABSTRACT

In welding a workpiece of considerable thickness with an energy beam, as an electron beam, focussed into a focal point on a beam axis, the tendency of molten material flowing out of the welding zone is eliminated or at least considerably reduced by continuously, preferably periodically, changing the focussing condition of the electron beam to shift the focus reciprocatingly along the beam axis. Preferably, the frequency of the shift of the focus along the beam axis is between 5 and 30 cycles per second, and the amplitude of the shift of the focus is at least one third of the thickness of the workpiece.

9 Claims, 1 Drawing Figure

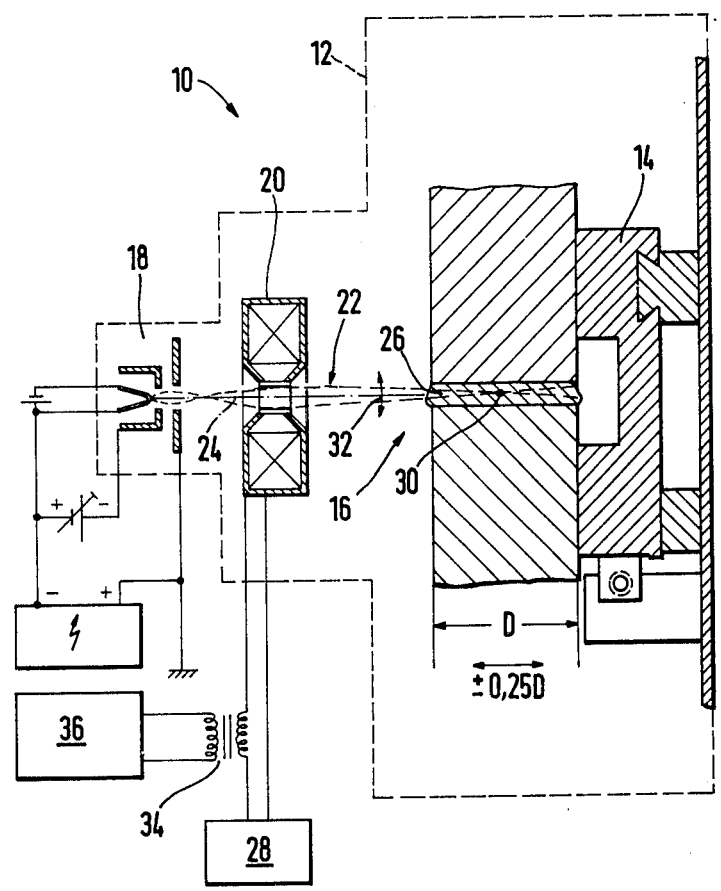

METHOD AND APPARATUS FOR ENERGY BEAM WELDING

The present invention relates to a method and an apparatus for energy beam welding by means of an energy beam which is directed onto a welding zone of a workpiece and is focussed into a focal point along a beam axis and which in the welding zone produces a molten mass which has the tendency to flow out of the welding zone. Specifically, the invention relates to electron beam (E.B.) welding and ion beam welding (charged particle beam welding).

BACKGROUND AND PRIOR ART

In electron beam welding the effect of gravity on the molten mass in the welding zone with increased thickness of the welded workpieces more and more outweighs the surface tension of the molten mass, which tends to hold back the molten mass in the welding zone. When welding with a vertically extending electron beam it is therefore in practice already necessary with workpieces of at least 50 mm thickness to place supporting strips etc. underneath in order to prevent the molten material from flowing out of the welding zone.

The problem of preventing the molten mass from flowing out of the welding zone is not quite so grave when welding thicker workpieces by means of a horizontally extending electron beam, since in this case not the whole weight of the molten mass acts on the free surface of the molten material on the front and rear side of the workpiece. With increasing workpiece thickness, however, generally from about 100 mm upwards, even when welding with a horizontally extending beam, it is impossible to prevent the molten mass from flowing out of the welding area. Attempts have been made to overcome this unwelcome feature by placing "backing" strips underneath the actual welding zone at the front and rear sides of the workpiece which are intended to stop the molten mass from flowing out of the welding zone. However, for geometric reasons this measure cannot always be used. On the contrary, it very often produces additional costs, sometimes very substantial ones, and very often even these measures cannot prevent the molten mass from flowing out of the welding zone.

THE INVENTION

It is the object of the present invention to eliminate or at least to considerably reduce the tendency of the molten mass to flow out of the welding zone produced by an energy beam, as an electron beam.

This is achieved according to the invention by means of an energy beam welding method of the aforementioned type whereby the tendency of the molten mass to flow out of the welding zone is reduced by continuously, preferably periodically, changing the focussing condition of the beam.

An apparatus for effecting this method comprises a focussing device, as a magnetic focussing lens in case of an electron beam, and a control device for continuously, preferably periodically, changing the focussing condition of the beam.

An apparatus for effecting this method comprises a focussing device, particularly a magnetic focussing lens an electron beam and a control device for continuously, preferably periodically, changing the focussing effect of this device.

The present invention is based on the following observations. By adjusting the focussing lens, i.e. the position of the focal point of an electron beam with respect to a workpiece it is possible to affect the tendency of the molten mass to flow out of the workpiece preferably on the front or rear face of the same. From this it can be concluded that when the focal point is moved to and fro it is possible to affect the molten mass in just the right way so that it adapts a kind of dynamic equilibrium which prevents it from flowing out at the front or back.

By means of this method and apparatus according to the invention it is therefore possible to eliminate or at least considerably reduce the tendency of the molten mass to flow out of the welding zone without the need of mechanical aids. DRAWING A preferred embodiment of the invention is explained in more detail with reference to the drawing, which is a highly simplified representation of an electron beam welding machine which is suited for performing the method according to the invention.

The figure shows, greatly simplified, an electron beam welding machine 10 which works according to the principle described e.g in U.S. Pat. No. 2,987,610 and which can be constructed in a substantially known manner. It comprises an evacuated chamber 12 including a movable support 14 for a workpiece 16 to be welded, e.g. a steel plate, as well as an electron beam generator 18 with a magnetic focussing lens 20. The electron beam generator is connected to the usual energy supply and control devices and can deliver an electron beam 22 for example with a beam voltage of 150 kV and a beam power of approximately 50 to 100 kW. The beam generator 18 is so arranged that the axis 24 of the electron beam extends in an essentially horizontal direction. In the workpiece the beam creates a horizontal welding zone filled with molten metal 26. In the case of workpieces with larger thickness D the molten metal 26 has the tendency to flow out of the welding zone at the front or rear face.

When welding with a horizontal electron beam 22 the lens current for the focussing lens 20, supplied by an adjustable d.c. source 28, is normally so adjusted that the electron beam 22 is focussed into a focal point 30, which in the direction of thickness of the workpiece lies roughly in the middle between the beam entrance side and the beam exit side of the workpiece, as illustrated in the drawing. It is also known to stabilise the position of the focal point 30 by a regulator. Also, the beam is normally moved to and fro transversely to the weld seam, as indicated by the double arrow 32. To simplify the drawing the usual deflector device required for this has been omitted.

These control features serve to achieve a pore-free weld seam which is as sound as possible, but are now designed to prevent the molten metal from flowing out of the welding zone.

In accordance with the invention the tendency of the molten metal 26 to flow out of the welding zone is eliminated or at least substantially reduced by continuously changing the focussing condition of the electron beam 22. For example, this can be achieved by superimposing an alternating current upon the direct lens current supplied by the d.c. source 28. For this a transformer 34 may be provided whose secondary winding is connected between the d.c. lens source 28 and the focussing lens 20 and whose primary winding is connected to an a.c. source 36. A circuit such as this makes it possible to move the focal point 30 to and fro along the beam axis 24 at the frequency of the a.c. supplied by the source 36. Preferably the focal point 30 is periodically moved from its central position by at least ±10%, preferably by approximately ±25% of the thickness D. The focal point wobble is achieved by using frequencies in the region of 10–30 Hz; depending on the situation other frequencies and other changes in the focal point may also be used. The superimposed a.c. may have many different shapes, but a sinusoidal current has already proved itself. The superimposed current may also be unsymmetrical, e.g. a sawtooth wave. The centre position of the focal point is generally situated in the central one third of the workpiece thickness.

EXAMPLE

Electron beam welding machine G600/K25 produced by Steigerwald Strahltechnik GmbH, Munich
Beam direction: Horizontal
Workpiece material: Lightly alloyed steel with 0.15% C. (type CK15)
Workpiece thickness D: 150 mm
Beam power: 60 kilowatts
Rate of advancement between workpiece and beam: 3 mm/sec
Average lens current: 2.6 A
Superimposed a.c.: ±0.3 A When welding with a horizontal beam, even when working with substantially larger thicknesses than before, usually up to at least 200 mm workpiece thickness, because of the focal point wobble it is no longer necessary to use additional mechanical means to stop the molten metal from flowing out. Even when welding with a vertical beam the tendency of the molten metal to flow out of the welding zone is substantially reduced by the displacement of the focal point according to the invention.

Both the centre as well as the front or rear end position of the focal point may be positioned externally of the workpiece. The optimum parameters may be found case by case on a test workpiece. Various changes and modifications may be made within the scope of the invention concept.

I claim:

1. A method for energy beam welding by means of an energy beam which has its beam axis directed onto a welding zone of a workpiece and is focussed in a focal point along the beam axis and which in the welding zone produces a molten mass which has the tendency to flow out of the welding zone, characterized in that the tendency of the molten mass to flow out of the welding zone is reduced by continuously changing the focussing condition of the beam.

2. The method as claimed in claim 1 wherein said beam is an electron beam.

3. The method according to claim 1 or 2, characterized in that the focal point of the beam is moved to and fro within an area of the welding zone and which is up to half the thickness of the workpiece diameter when measured along an axis of the beam.

4. Method according to claim 1 or 2, characterized in that the focussing condition is changed at a frequency of between 5 and 30 Hz;

5. An apparatus for welding with a beam of charged particles comprising a beam generating system which delivers said beam; a workpiece support which supports a workpiece in the path of the beam and moves it relative to the same; a focussing device for focussing the beam in a focal point along a beam axis; an energy source for the beam generating system and an energy source for the focussing device, characterzed in that the energy source (28, 34, 36) for the focussing device (20) comprises means (34, 36) for continuously changing the focussing condition of the electron beam (22) with respect to said workpiece.

6. The apparatus as claimed in claim 5, wherein the focussing device comprises a magnetic focussing lens, characterized in that the energy source for the magnetic lens (20) produces an a.c. superimposed d.c. current.

7. The apparatus as claimed in claim 5 or 6, characterized in that the beam axis extends in a substantially horizontal direction.

8. The apparatus as claimed in claim 5 wherein said beam generating system is an electron beam gun.

9. The apparatus as claimed in claim 6 wherein said energy source produces a current which has an effective ac amplitude of at least 5 to 10 percent of the dc amplitude.

* * * * *